(12) United States Patent
Huang et al.

(10) Patent No.: US 12,183,736 B2
(45) Date of Patent: *Dec. 31, 2024

(54) BACKSIDE PN JUNCTION DIODE

(71) Applicant: Taiwan Semiconductor Manufacturing Co., Ltd., Hsinchu (TW)

(72) Inventors: Yu-Xuan Huang, Hsinchu (TW); Ching-Wei Tsai, Hsinchu (TW); Jam-Wem Lee, Hsinchu (TW); Kuo-Ji Chen, Taipei County (TW); Kuan-Lun Cheng, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/356,802

(22) Filed: Jul. 21, 2023

(65) Prior Publication Data
US 2023/0361117 A1 Nov. 9, 2023

Related U.S. Application Data

(63) Continuation of application No. 17/510,014, filed on Oct. 25, 2021, now Pat. No. 11,735,587, which is a
(Continued)

(51) Int. Cl.
*H01L 27/088* (2006.01)
*H01L 27/07* (2006.01)
(Continued)

(52) U.S. Cl.
CPC ...... *H01L 27/0886* (2013.01); *H01L 27/0727* (2013.01); *H01L 29/0653* (2013.01);
(Continued)

(58) Field of Classification Search
CPC ............. H01L 27/0886; H01L 27/0727; H01L 29/0653; H01L 29/41791; H01L 29/66795;
(Continued)

(56) References Cited

U.S. PATENT DOCUMENTS 9,818,872 B2 11/2017 Ching et al.
9,887,269 B2 2/2018 Ching et al.
(Continued)

*Primary Examiner* — Changhyun Yi
(74) *Attorney, Agent, or Firm* — HAYNES AND BOONE, LLP

(57) ABSTRACT

The present disclosure provides embodiments of semiconductor devices. A semiconductor device according to the present disclosure include an elongated semiconductor member surrounded by an isolation feature and extending lengthwise along a first direction, a first source/drain feature and a second source/drain feature over a top surface of the elongated semiconductor member, a vertical stack of channel members each extending lengthwise between the first source/drain feature and the second source/drain feature along the first direction, a gate structure wrapping around each of the channel members, an epitaxial layer deposited on the bottom surface of the elongated semiconductor member, a silicide layer disposed on the epitaxial layer, and a conductive layer disposed on the silicide layer.

20 Claims, 17 Drawing Sheets

Related U.S. Application Data continuation of application No. 16/901,816, filed on Jun. 15, 2020, now Pat. No. 11,158,634.

(51) Int. Cl.
*H01L 29/06* (2006.01)
*H01L 29/417* (2006.01)
*H01L 29/66* (2006.01)
*H01L 29/78* (2006.01)

(52) U.S. Cl.
CPC .. *H01L 29/41791* (2013.01); *H01L 29/66795* (2013.01); *H01L 29/785* (2013.01); *H01L 2029/7858* (2013.01)

(58) Field of Classification Search
CPC ........... H01L 29/785; H01L 2029/7858; H01L 29/41766; H01L 29/0673; H01L 29/78696; H01L 29/42392
See application file for complete search history.

(56) References Cited

U.S. PATENT DOCUMENTS

| | | | |
|---|---|---|---|
| 9,899,398 | B1 | 2/2018 | Colinge et al. |
| 10,032,627 | B2 | 10/2018 | Lin et al. |
| 10,109,721 | B2 | 10/2018 | Lin et al. |
| 10,157,799 | B2 | 12/2018 | Ching et al. |
| 10,199,502 | B2 | 2/2019 | Huang et al. |
| 11,158,634 | B1 | 10/2021 | Huang |
| 11,735,587 | B2 * | 8/2023 | Huang .............. H01L 29/41791 257/365 |
| 2017/0221893 | A1 | 8/2017 | Tak |
| 2018/0175036 | A1 | 6/2018 | Ching et al. |
| 2020/0294998 | A1 | 9/2020 | Lilak |
| 2020/0365706 | A1 | 11/2020 | Lee |
| 2021/0074823 | A1 | 3/2021 | Glass |
| 2021/0151432 | A1 | 5/2021 | Song |

* cited by examiner

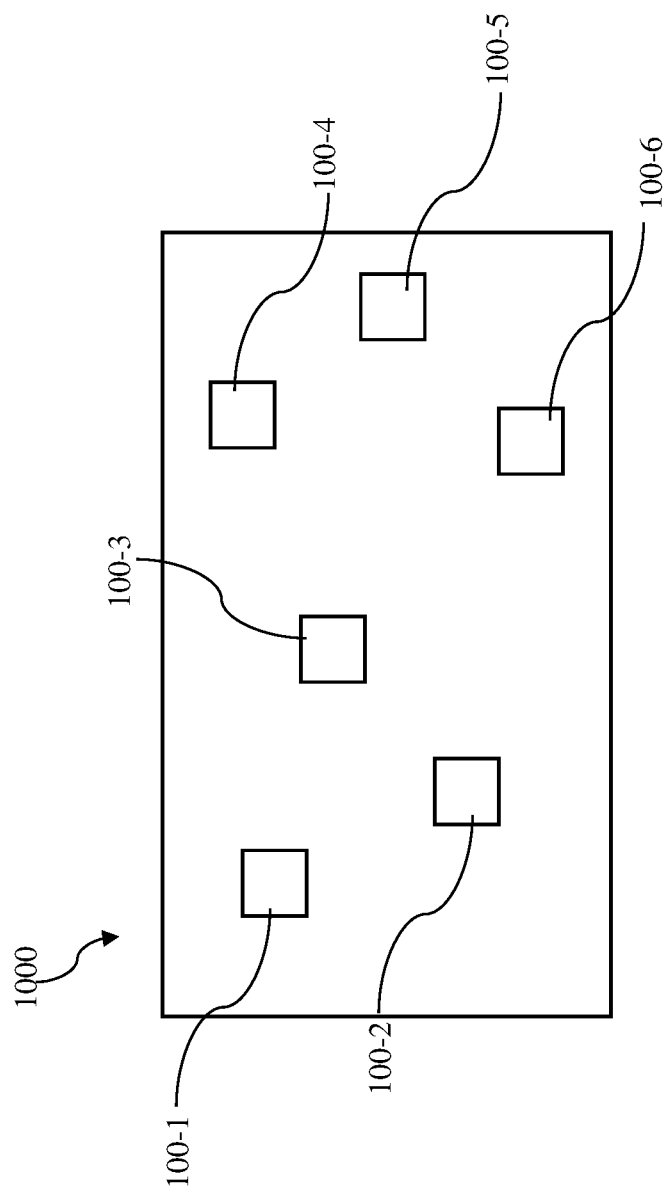

BACKSIDE PN JUNCTION DIODE

PRIORITY DATA

This application is a continuation application of U.S. patent application Ser. No. 17/510,014, filed Oct. 25, 2021, which is a continuation of U.S. patent application Ser. No. 16/901,816, filed Jun. 15, 2020, each of which is incorporated by reference herein in its entirety.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Multi-gate devices, such as fin field-effect transistors (FinFETs) and multi-bridge-channel (MBC) transistors (also known as gate-all-around (GAA) transistors, surrounding gate transistors (SGTs), nanowire transistors, or nanosheet transistors), have been introduced in an effort to improve gate control by increasing gate-channel coupling, reduce OFF-state current, and reduce short-channel effects (SCEs). The three-dimensional structure of the multi-gate devices, allows them to be aggressively scaled while maintaining gate control and mitigating SCEs. However, even with the introduction of multi-gate devices, aggressive scaling down of IC dimensions has resulted in densely spaced gate structures and source/drain contacts. The densely packed gate structures and source/drain contacts pose challenges to form routing on only one side of the substrate. Some conventional techniques have been proposed to move some of the routing features to the backside of the substrate. Although structures produced by these conventional techniques are generally adequate for their intended purposes, they are not satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 17 illustrates an integrated circuit (IC) device that includes one or more of the semiconductor devices in FIGS. 1, 4, 7, 10, 13, and 15, according to various aspects of the present disclosure.

DETAILED DESCRIPTION

Figure 1:
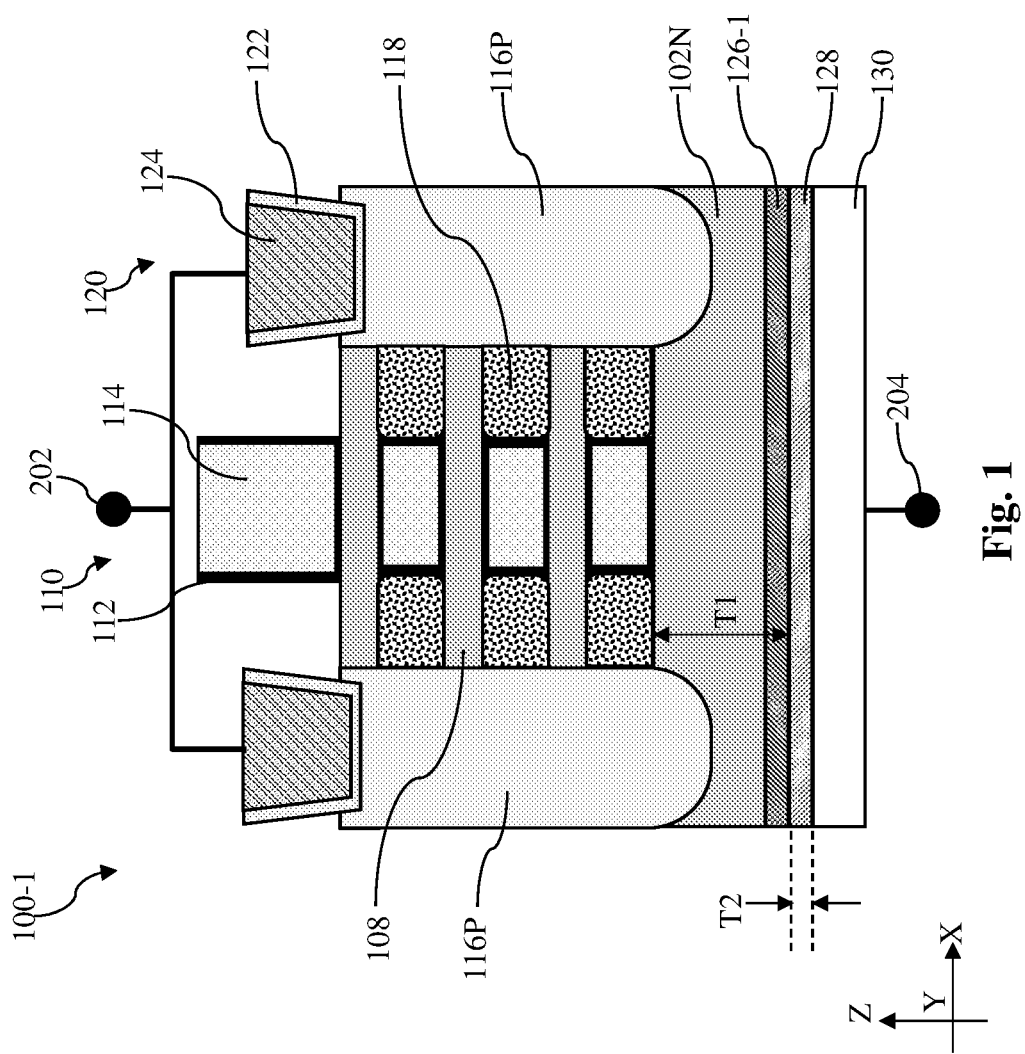
FIG. 1 is a fragmentary cross-section view a first semiconductor device along a first direction, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s)

as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure generally relates to semiconductor devices. Particularly, the present disclosure relates to backside routing and embedded PN junction diodes.

FIG. 1 illustrates a fragmentary cross-sectional view of a first semiconductor device 100-1 along the Y direction. In some embodiments represented in FIG. 1, the first semiconductor device 100-1 has a structure similar to a multi-bridge-channel (MBC) transistor that includes a plurality of bridge-like channel members (or channel structures). An MBC transistor may be referred to as a gate-all-around (GAA) transistor or a surrounding gate transistor (SGT) as its gate structure wraps around each of the channel members (or channel structures). An MBC transistor may also be referred to as nanosheet transistor or a nanowire transistor because each of the bridge-like channel members is nanoscale and may resemble a wire or a sheet. Referring now to FIG. 1, the first semiconductor device 100-1 includes a plurality of channel members 108 extending along the X direction between two p-type source/drain features 116P. A gate structure 110 that extends lengthwise along the Y direction wraps around each of the plurality of channel members 108. The Y direction is perpendicular to the X direction. As shown in FIG. 1, the gate structure 110 includes a gate dielectric layer 112 and a gate electrode 114. The gate structure 110 is isolated from the p-type source/drain features 116P by a plurality of inner spacer features 118. A source/drain contact 120 is disposed over and electrically coupled to each of the p-type source/drain features 116P. In some implementations represented in FIG. 1, the source/drain contact 120 includes a barrier layer 122 and a metal fill layer 124.

In some embodiments, the channel members 108 may include a semiconductor material, such as silicon, germanium, or silicon germanium. The gate dielectric layer 112 may include an interfacial layer and a high-k dielectric layer. In some embodiments, the interfacial layer may include a dielectric material such as silicon oxide layer or silicon oxynitride. The high-k dielectric layer is formed of a high-k (dielectric constant greater than about 3.9) dielectric material that may include hafnium oxide, titanium oxide, hafnium zirconium oxide, tantalum oxide, hafnium silicon oxide, zirconium oxide, zirconium silicon oxide, combinations thereof, or other suitable materials. The gate electrode 114 may include one or more work function layers and a metal fill layer. The one or more work function layers may include n-type work function layers and p-type work function layers. Example n-type work function layers may be formed of aluminum, titanium aluminide, titanium aluminum carbide, tantalum silicon carbide, tantalum silicon aluminum, tantalum silicon carbide, tantalum silicide, or hafnium carbide. Example p-type work function layers may be formed of titanium nitride, titanium silicon nitride, tantalum nitride, tungsten carbonitride, or molybdenum. The metal fill layer may be formed of a metal, such as tungsten (W), ruthenium (Ru), cobalt (Co) or copper (Cu). The p-type source/drain feature 116P may be an epitaxial feature that includes a semiconductor material such as silicon germanium and is doped with a p-type dopant, such as boron (B).

In some embodiments, the inner spacer features 118 include silicon oxide, hafnium silicide, silicon oxycarbide, aluminum oxide, zirconium silicide, aluminum oxynitride, zirconium oxide, hafnium oxide, titanium oxide, zirconium aluminum oxide, zinc oxide, tantalum oxide, lanthanum oxide, yttrium oxide, tantalum carbonitride, silicon nitride, silicon oxycarbonitride, silicon, zirconium nitride, or silicon carbonitride. The metal fill layer 124 for the source/drain contact 120 may be formed of tungsten (W), ruthenium (Ru), cobalt (Co), nickel (Ni), or copper (Cu). The barrier layer 122 may be formed of titanium nitride (TiN), tantalum nitride (TaN), titanium (Ti), molybdenum (Mo), cobalt nitride (CoN), tungsten nitride (WN), or titanium silicon nitride (TiSiN).

The gate structure 110, the p-type source/drain features 116P, and the bottommost inner spacer features 118 are disposed on an n-type well region 102N. In some implementations, the n-type well region 102N is doped with an n-type dopant such as phosphorus (P) or arsenide (As) and has a first doping concentration between about $1\times10^{18}$ and about $5\times10^{18}$ atoms/cm$^2$. The n-type well region 102N is disposed over and electrically coupled to a backside conductive feature 130. In some embodiments, the backside conductive feature 130 may be a power rail that is coupled to Vdd (i.e., positive supply voltage) or Vss (i.e., ground or negative supply voltage). To reduce contact resistance between the n-type well region 102N and the backside conductive feature 130, the first semiconductor device 100-1 further includes a first epitaxial layer 126-1 and a silicide layer 128. In some implementations, the first epitaxial layer 126-1 is epitaxially grown on the n-type well region 102N is thus disposed directly on the n-type well region 102N. The silicide layer 128 interposes between the first epitaxial layer 126-1 and the backside conductive feature 130. In some embodiments, the first epitaxial layer 126-1 is doped in-situ with an n-type dopant, such as phosphorus (P) or arsenide (As), and has a second doping concentration between about $1\times10^{19}$ and about $1\times10^{20}$ atoms/cm$^2$. The second doping concentration is greater than the first doping concentration such that the first epitaxial layer 126-1 has increased conductivity. The silicide layer 128 may include titanium silicide (TiSi), nickel silicide (NiSi), cobalt silicide (CoSi), or titanium silicon nitride (TiSiN). The backside conductive feature 130 may be formed of tungsten (W), titanium (Ti), titanium nitride (TiN), ruthenium (Ru), cobalt (Co), nickel (Ni), or copper (Cu).

As shown in FIG. 1, measured from a bottommost inner spacer feature 118, the n-type well region 102N and the first epitaxial layer 126-1 may collectively have a first thickness T1 along the Z direction. In some instances, the first thickness T1 may be between about 30 nm and about 150 nm. In some implementations, the silicide layer 128 may have a second thickness T2 along the Z direction. The second thickness T2 may be between about 3 nm and about 5 nm.

Figure 2:
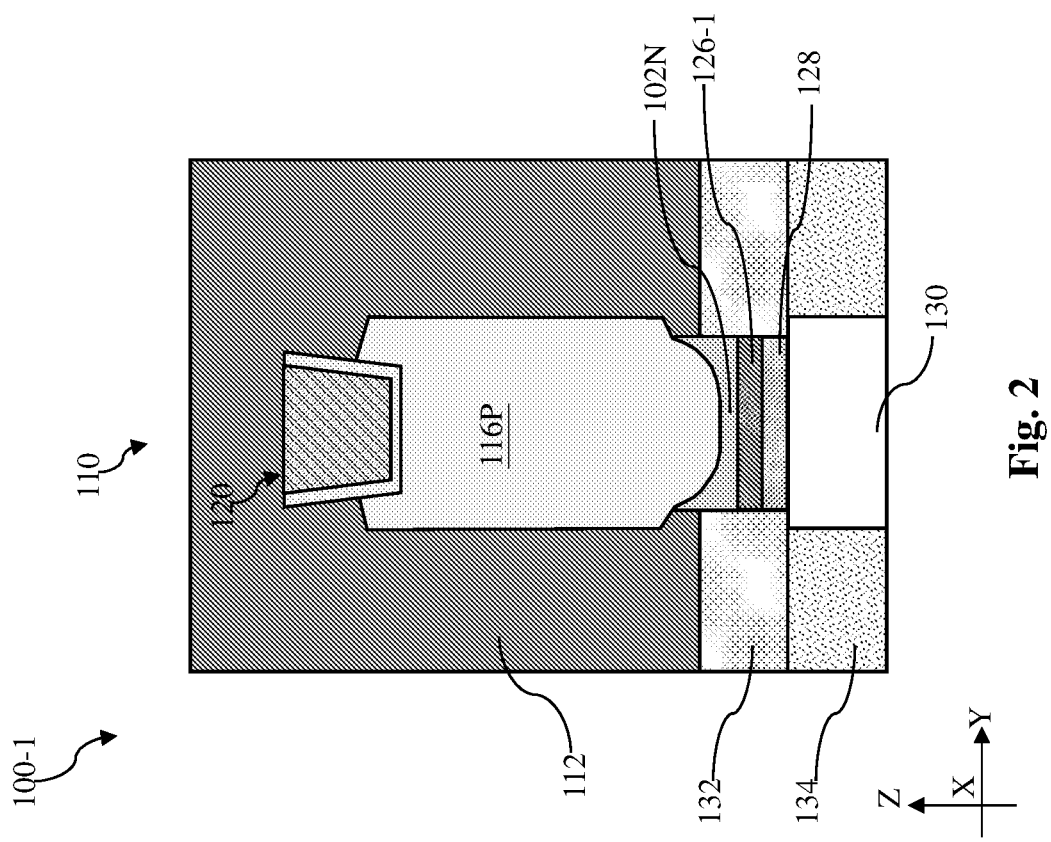
FIG. 2 is a fragmentary cross-section view the first semiconductor device in FIG. 1 along a second direction, according to various aspects of the present disclosure.

Reference is now made to FIG. 2, which illustrates a cross-sectional view of the first semiconductor device 100-1 along the X direction. The n-type well region 102N is defined in an isolation feature 132. It is noted that the isolation feature 132 is not shown in FIG. 1 as the cross-sectional plane of FIG. 1 does not cut through the isolation feature 132. The n-type well region 102N is formed from a substrate and the isolation feature 132 is disposed over the substrate. The structure shown in FIG. 2 is formed after planarizing the substrate using for example, a chemical mechanical polishing (CMP) process, until a bottom surface of the n-type well region 102N is coplanar with bottom surfaces of the isolation feature 132. After the planar bottom surface is formed, the n-type well region 102N is recessed to form a backside recess. The first epitaxial layer 126-1 is epitaxially grown over the exposed surface of the n-type well region 102N and the silicide layer 128 is formed over the first epitaxial layer 126-1. After a planarization process, such as a CMP process, a dielectric layer 134 is deposited over the isolation feature 132 and the silicide layer 128. An opening is then formed in the dielectric layer 134 by use of lithography processes and etch processes to expose the silicide layer 128. Thereafter, the backside conductive feature 130 is deposited over the silicide layer 128. Another planarization process, such as a CMP process, may be performed to planarize the bottom surface such that the bottom surface of the backside conductive feature 130 and the top surface of the dielectric layer 134 are coplanar. As a result, the backside conductive feature 130 is disposed within the dielectric layer 134. The first epitaxial layer 126-1 and the silicide layer 128 are disposed within the isolation feature 132. It can be seen from FIGS. 1 and 2 that the n-type well region 102N extends lengthwise along the X direction and may be regarded as an elongated semiconductor member that is doped with an n-type dopant. It is noted that the term "bottom" is used to refer to features in FIG. 2 as shown and does not in any way suggest or imply the orientation of the substrate during the fabrication processes. Some of the processes described here may be performed when the first semiconductor device 100-1 is turned upside down.

In some embodiments, the isolation feature 132 may include silicon oxide, silicon nitride, silicon oxynitride, fluorine-doped silicate glass (FSG), a low-k dielectric, combinations thereof, and/or other suitable materials. The isolation feature 132 may also be referred to as a shallow trench isolation (STI) feature 132. The dielectric layer 134 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials.

Figure 3:
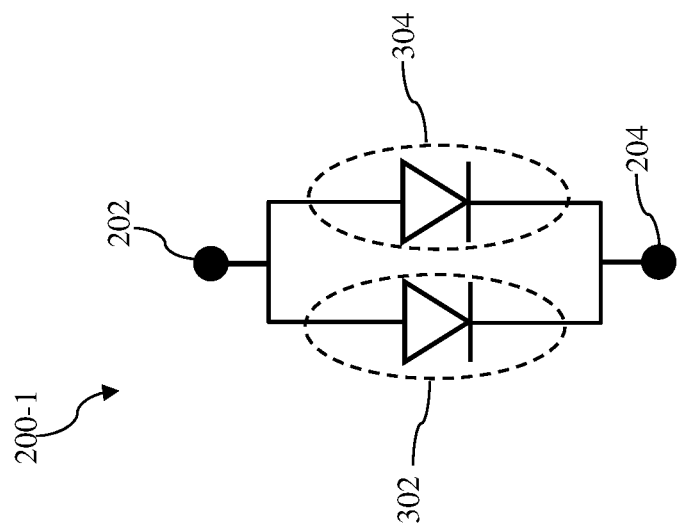
FIG. 3 illustrates an equivalent circuit diagram of the first semiconductor device in FIG. 1, according to various aspects of the present disclosure.

In some embodiments illustrated in FIG. 1, although the first semiconductor device 100-1 includes structures of a transistor, it does not function as one and is not electrically connected as one. As shown in FIG. 1, the gate structure 110 of the first semiconductor device 100-1 is electrically floating and is not configured to turn on the channel members 108. The source/drain contacts 120 may be resistively coupled to a first node 202 and the backside conductive feature 130 is resistively coupled to a second node 204. When connected as such, the first semiconductor device 100-1 may function as two parallel PN junction diodes— first PN junction diode 302 and the second PN junction diode 304, shown in a first equivalent circuit 200-1 in FIG. 3. Each of the first PN junction diode 302 and the second PN junction diode 304 corresponds to one of the p-type source/drain feature 116P over and in contact with the n-type well region 102N.

Figure 4:
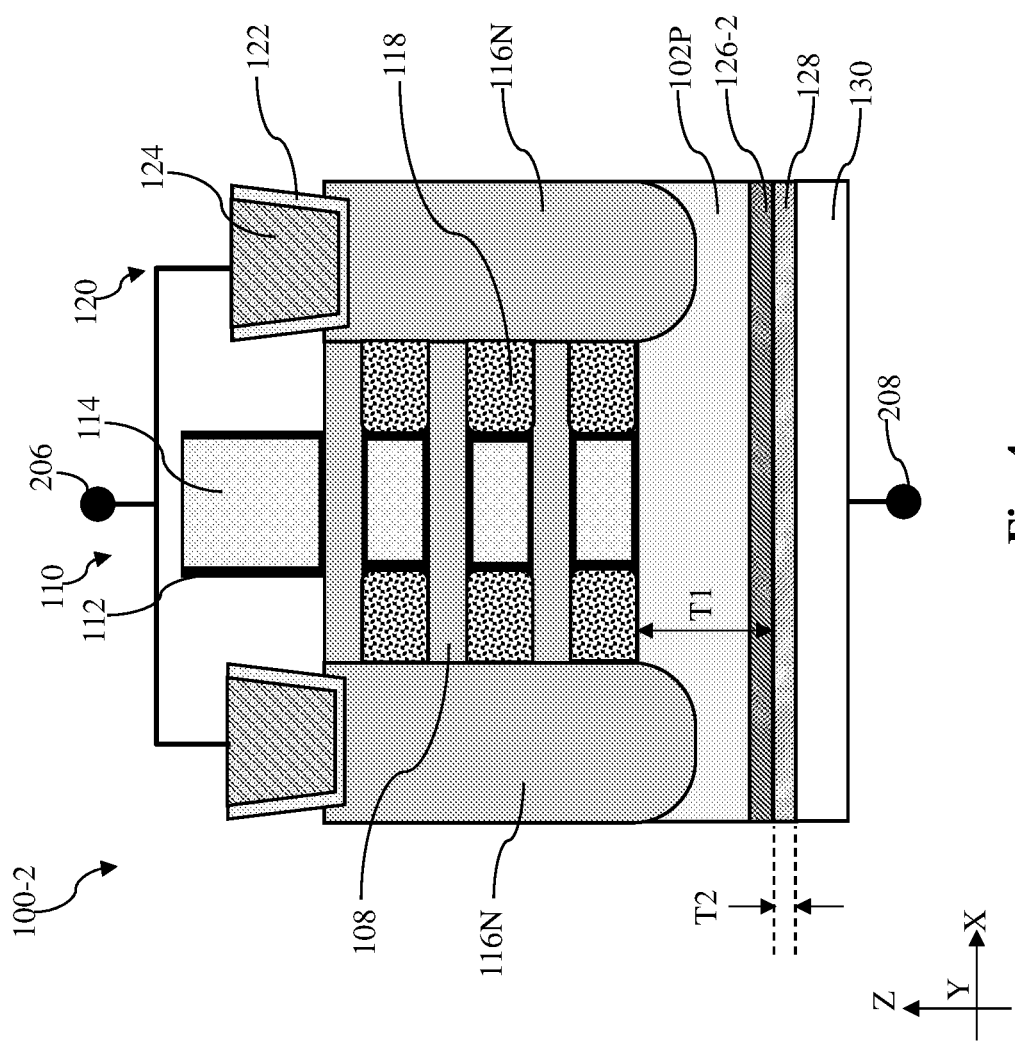
FIG. 4 is a fragmentary cross-section view a second semiconductor device along a first direction, according to various aspects of the present disclosure.

FIG. 4 illustrates a fragmentary cross-sectional view of a second semiconductor device 100-2 along the Y direction. In some embodiments represented in FIG. 4, the second semiconductor device 100-2 has a structure similar to an MBC transistor that includes a plurality of bridge-like channel members (or channel structures). An MBC transistor may be referred to as a gate-all-around (GAA) transistor or a surrounding gate transistor (SGT) as its gate structure wraps around each of the channel members (or channel structures). An MBC transistor may also be referred to as nanosheet transistor or a nanowire transistor because each of the bridge-like channel members is nanoscale and may resemble a wire or a sheet. Referring now to FIG. 4, the second semiconductor device 100-2 includes a plurality of channel members 108 extending along the X direction between two n-type source/drain features 116N. A gate structure 110 that extends lengthwise along the Y direction wraps around each of the plurality of channel members 108. As shown in FIG. 4, the gate structure 110 includes a gate dielectric layer 112 and a gate electrode 114. The gate structure 110 is isolated from the n-type source/drain features 116N by a plurality of inner spacer features 118. A source/drain contact 120 is disposed over and electrically coupled to each of the n-type source/drain features 116N. In some implementations represented in FIG. 4, the source/drain contact 120 includes a barrier layer 122 and a metal fill layer 124.

The channel members 108, the gate dielectric layer 112, gate electrode 114, the inner spacer features 118, the source/drain contact 120 of the second semiconductor device 100-2 may be similar to those of the first semiconductor device 100-1 shown in FIG. 1. Detailed descriptions of them are therefore omitted for brevity.

The gate structure 110, the n-type source/drain features 116N, and the bottommost inner spacer features 118 are disposed on a p-type well region 102P. In some implementations, the p-type well region 102P is doped with a p-type dopant such as boron (B) and has a third doping concentration between about $1\times10^{18}$ and about $5\times10^{18}$ atoms/cm$^2$. The p-type well region 102P is disposed over and electrically coupled to a backside conductive feature 130. In some embodiments, the backside conductive feature 130 may be a power rail that is coupled to Vdd (i.e., positive supply voltage) or Vss (i.e., ground or negative supply voltage). To reduce contact resistance between the p-type well region 102P and the backside conductive feature 130, the semiconductor device 100-2 further includes a second epitaxial layer 126-2 and a silicide layer 128. In some implementations, the second epitaxial layer 126-2 is epitaxially grown on the p-type well region 102P is thus disposed directly on the p-type well region 102P. The silicide layer 128 interposes between the second epitaxial layer 126-2 and the backside conductive feature 130. In some embodiments, the second epitaxial layer 126-2 is doped in-situ with a p-type dopant, such as boron (B), and has a fourth doping concentration between about $1\times10^{19}$ and about $1\times10^{20}$ atoms/cm$^2$. The silicide layer 128 may include titanium silicide (TiSi), nickel silicide (NiSi), cobalt silicide (CoSi), or titanium silicon nitride (TiSiN). The backside conductive feature 130 may be formed of tungsten (W), titanium (Ti), titanium nitride (TiN), ruthenium (Ru), cobalt (Co), nickel (Ni), or copper (Cu).

Figure 5:
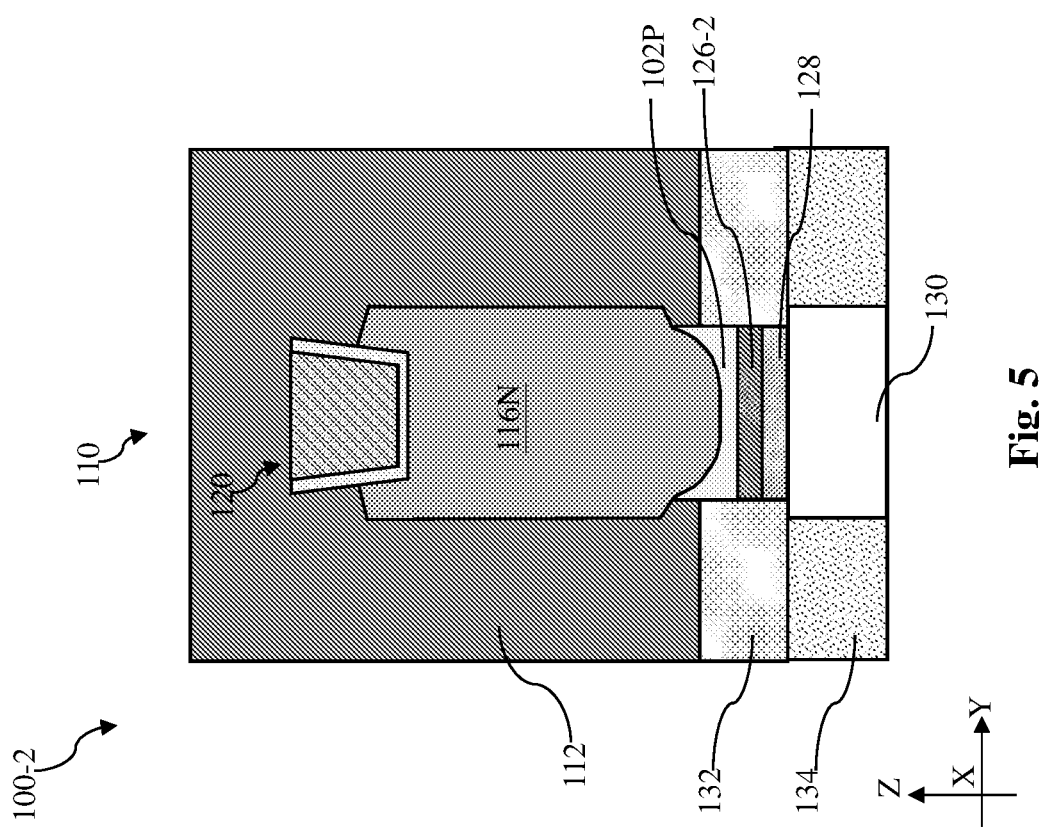
FIG. 5 is a fragmentary cross-section view the second semiconductor device in FIG. 4 along a second direction, according to various aspects of the present disclosure.

Reference is now made to FIG. 5, which illustrates a cross-sectional view of the second semiconductor device 100-2 along the X direction. The p-type well region 102P is defined in an isolation feature 132. It is noted that the isolation feature 132 is not shown in FIG. 4 as the cross-sectional plane of FIG. 4 does not cut through the isolation feature 132. The p-type well region 102P is formed from a substrate and the isolation feature 132 is disposed over the substrate. The structure shown in FIG. 5 is formed after planarizing the substrate using for example, a chemical mechanical polishing (CMP) process, until a bottom surface of the p-type well region 102P is coplanar with bottom surfaces of the isolation feature 132. After the planar bottom surface is formed, the p-type well region 102P is recessed to form a backside recess. The second epitaxial layer 126-2 is epitaxially grown over the exposed surface of the p-type well region 102P and the silicide layer 128 is formed over the second epitaxial layer 126-2. After a planarization process, such as a CMP process, a dielectric layer 134 is deposited over the isolation feature 132 and the silicide layer 128. An opening is then formed in the dielectric layer 134 by use of lithography processes and etch processes to expose the silicide layer 128. Thereafter, the backside conductive feature 130 is deposited over the silicide layer 128. Another planarization process, such as a CMP process, may be performed to planarize the bottom surface such that the bottom surface of the backside conductive feature 130 and the top surface of the dielectric layer 134 are coplanar. As a result, the backside conductive feature 130 is disposed within the dielectric layer 134. The second epitaxial layer 126-2 and the silicide layer 128 are disposed within the isolation feature 132. After the planar bottom surface is formed, a dielectric layer 134 is deposited over the isolation feature 132 and the p-type well region 102P. An opening is then formed in the dielectric layer 134 by use of lithography processes and etch processes to expose the p-type well region 102P. The second epitaxial layer 126-2 is subsequently epitaxially grown over the exposed surface of the p-type well region 102P. The silicide layer 128 is formed over the second epitaxial layer 126-2. Thereafter, the backside conductive feature 130 is deposited over the silicide layer 128. A planarization process, such as a chemical mechanical polishing (CMP) process, may be performed to planarize the bottom surface such that the bottom surface of the backside conductive feature 130 and the top surface of the dielectric layer 134 are coplanar. As a result, the dielectric layer 134 is in contact with sidewalls of the second epitaxial layer 126-2, the silicide layer 128, and the backside conductive feature 130. Put differently, the second epitaxial layer 126-2, the silicide layer 128, and the backside conductive feature 130 are disposed within the dielectric layer 134. It can be seen from FIGS. 4 and 5 that the p-type well region 102P extends lengthwise along the X direction and may be regarded as an elongated semiconductor member that is doped with a p-type dopant. It is noted that the term "bottom" is used to refer to features in FIG. 5 as shown and does not in any way suggest or imply the orientation of the substrate during the fabrication processes. Some of the processes described here may be performed when the second semiconductor device 100-2 is turned upside down.

The isolation feature 132 and the dielectric layer 134 of the second semiconductor device 100-2 may be similar to those of the first semiconductor device 100-1 shown in FIG. 1. Detailed descriptions of them are therefore omitted for brevity.

Figure 6:
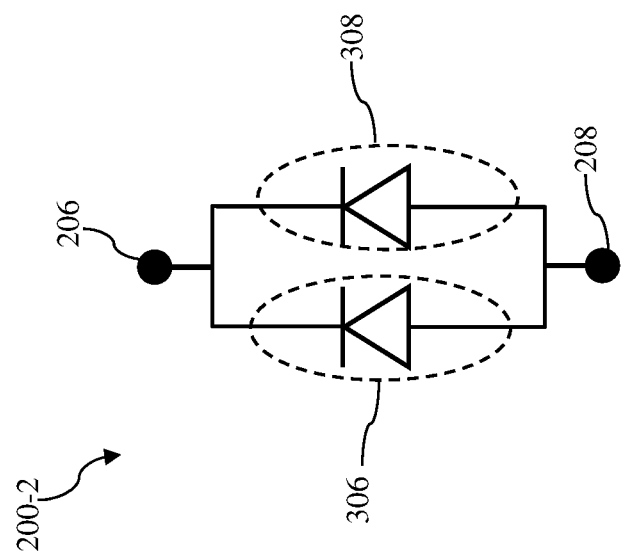
FIG. 6 illustrates an equivalent circuit diagram of the second semiconductor device in FIG. 4, according to various aspects of the present disclosure.

In some embodiments illustrated in FIG. 4, although the second semiconductor device 100-2 includes structures of a transistor, it does not function as one and is not connected as one. As shown in FIG. 4, the gate structure 110 is electrically floating and is not configured to turn on channel members 108. The source/drain contacts 120 may be resistively coupled to a third node 206 and the backside conductive feature 130 is resistively coupled to a fourth node 208. When connected as such, the second semiconductor device 100-2 may function as two parallel PN junction diodes—third PN junction diode 306 and the fourth PN junction diode 308, shown in a second equivalent circuit 200-2 in FIG. 6. Each of the third PN junction diode 306 and the fourth PN junction diode 308 corresponds to one of the n-type source/drain feature 116N over and in contact with the p-type well region 102P.

Figure 7:
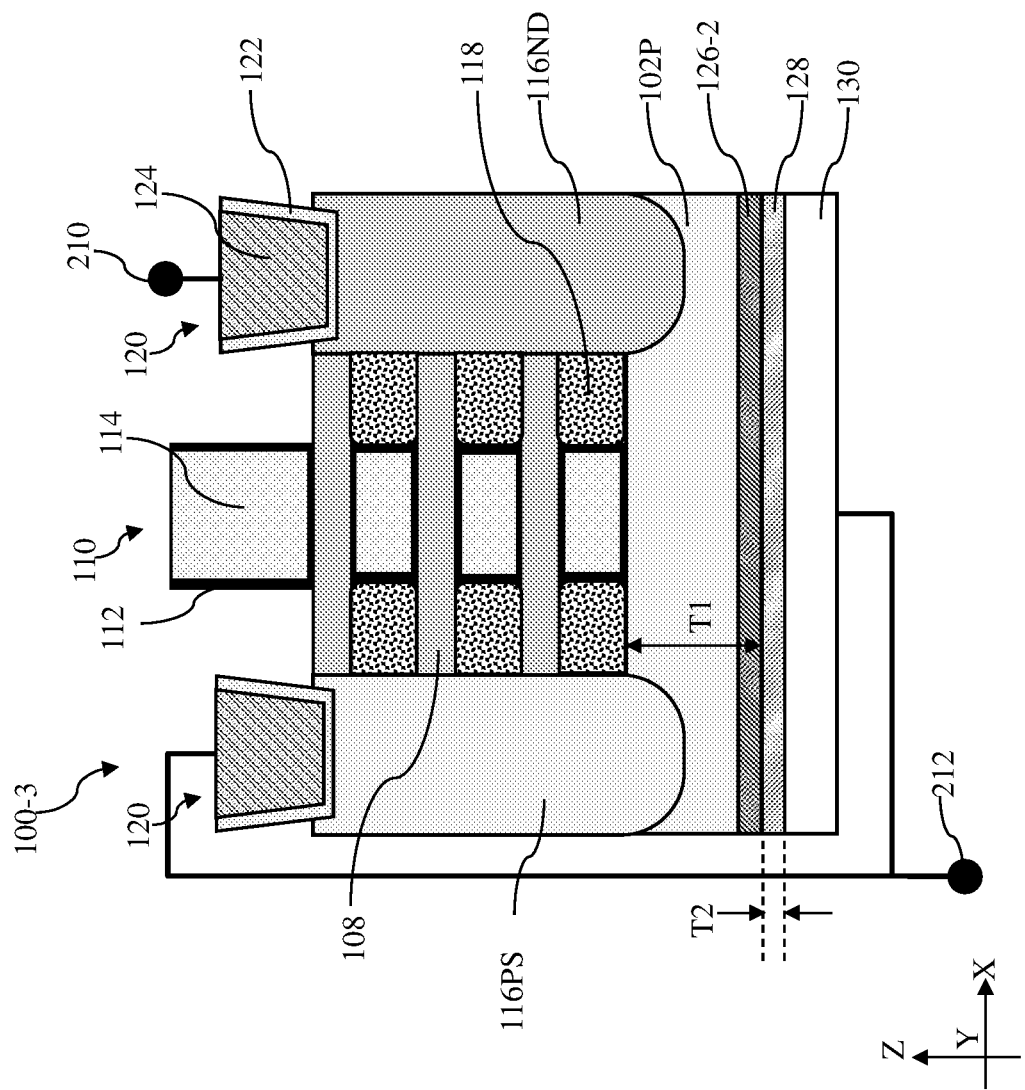
FIG. 7 is a fragmentary cross-section view a third semiconductor device along a first direction, according to various aspects of the present disclosure.

FIG. 7 illustrates a fragmentary cross-sectional view of a third semiconductor device 100-3 along the Y direction. In some embodiments represented in FIG. 7, the third semiconductor device 100-3 has a structure similar to an MBC transistor that includes a plurality of bridge-like channel members (or channel structures). An MBC transistor may be referred to as a gate-all-around (GAA) transistor or a surrounding gate transistor (SGT) as its gate structure wraps around each of the channel members (or channel structures). An MBC transistor may also be referred to as nanosheet transistor or a nanowire transistor because each of the bridge-like channel members is nanoscale and may resemble a wire or a sheet. Referring now to FIG. 7, the third semiconductor device 100-3 includes a plurality of channel members 108 extending along the X direction between a p-type source feature 116PS and an n-type drain feature 116ND. A gate structure 110 that extends lengthwise along the Y direction wraps around each of the plurality of channel members 108. As shown in FIG. 7, the gate structure 110 includes a gate dielectric layer 112 and a gate electrode 114. The gate structure 110 is isolated from the p-type source features 116PS and the n-type drain feature 116ND by a plurality of inner spacer features 118. A source/drain contact 120 is disposed over and electrically coupled to each of the p-type source feature 116PS and the n-type drain feature 116ND. In some implementations represented in FIG. 7, the source/drain contact 120 includes a barrier layer 122 and a metal fill layer 124.

The channel members 108, the gate dielectric layer 112, gate electrode 114, the inner spacer features 118, the source/drain contact 120 of the third semiconductor device 100-3 may be similar to those of the first semiconductor device 100-1 shown in FIG. 1. Detailed descriptions of them are therefore omitted for brevity.

The gate structure 110, the p-type source feature 116PS, the n-type drain feature 116ND and the bottommost inner spacer features 118 are disposed on a p-type well region 102P. In some implementations, the p-type well region 102P is doped with a p-type dopant such as boron (B) and has the first doping concentration between about $1\times10^{18}$ and about $5\times10^{18}$ atoms/cm². The p-type well region 102P is disposed over and electrically coupled to a backside conductive feature 130. In some embodiments, the backside conductive feature 130 may be a power rail that is coupled to Vdd (i.e., positive supply voltage) or Vss (i.e., ground or negative supply voltage). To reduce contact resistance between the p-type well region 102P and the backside conductive feature 130, the third semiconductor device 100-3 further includes the second epitaxial layer 126-2 and the silicide layer 128. In some implementations, the second epitaxial layer 126-2 is epitaxially grown on the p-type well region 102P is thus disposed directly on the p-type well region 102P. The silicide layer 128 interposes between the second epitaxial layer 126-2 and the backside conductive feature 130. In some embodiments, the second epitaxial layer 126-2 is doped in-situ with a p-type dopant, such as boron (B), and has a fourth doping concentration between about $1\times10^{19}$ and about $1\times10^{20}$ atoms/cm². As compared to the p-type well region 102P, the p-type source feature 116PS is more heavily doped. In some instances, the p-type source feature 116PS may also be doped at the fourth doping concentration. The silicide layer 128 may include titanium silicide (TiSi), nickel silicide (NiSi), cobalt silicide (CoSi), or titanium silicon nitride (TiSiN). The backside conductive feature 130 may be formed of tungsten (W), titanium (Ti), titanium nitride (TiN), ruthenium (Ru), cobalt (Co), nickel (Ni), or copper (Cu).

Figure 8:
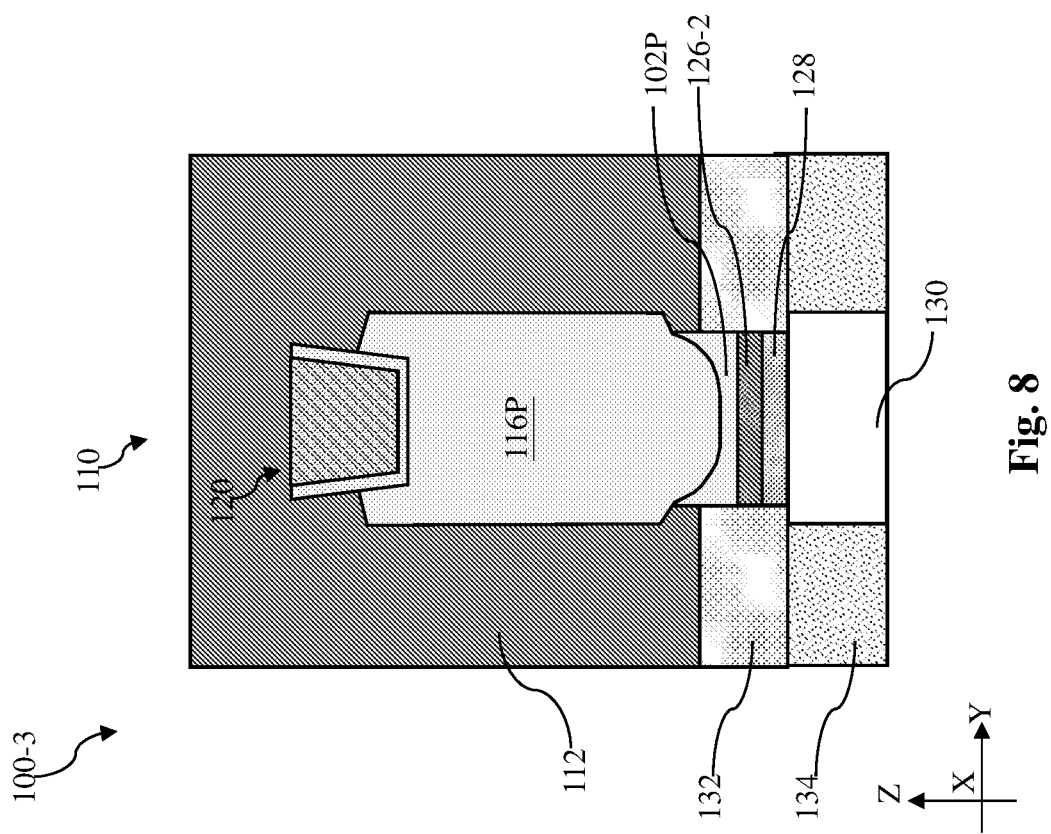
FIG. 8 is a fragmentary cross-section view the third semiconductor device in FIG. 7 along a second direction, according to various aspects of the present disclosure.

Reference is now made to FIG. 8, which illustrates a cross-sectional view of the third semiconductor device 100-3 along the X direction. The p-type well region 102P is defined in an isolation feature 132. It is noted that the isolation feature 132 is not shown in FIG. 7 as the cross-sectional plane of FIG. 7 does not cut through the isolation feature 132. The p-type well region 102P is formed from a substrate and the isolation feature 132 is disposed over the substrate. The structure shown in FIG. 8 is formed after planarizing the substrate using for example, a chemical mechanical polishing (CMP) process, until a bottom surface of the p-type well region 102P is coplanar with bottom surfaces of the isolation feature 132. After the planar bottom surface is formed, the p-type well region 102P is recessed to form a backside recess. The second epitaxial layer 126-2 is epitaxially grown over the exposed surface of the p-type well region 102P and the silicide layer 128 is formed over the second epitaxial layer 126-2. After a planarization process, such as a CMP process, a dielectric layer 134 is deposited over the isolation feature 132 and the silicide layer 128. Thereafter, the backside conductive feature 130 is deposited over the silicide layer 128. Another planarization process, such as a CMP process, may be performed to planarize the bottom surfaces such that the bottom surface of the backside conductive feature 130 and the top surface of the dielectric layer 134 are coplanar. As a result, the backside conductive feature 130 is disposed within the dielectric layer 134. The second epitaxial layer 126-2 and the silicide layer 128 are disposed within the isolation feature 132. It can be seen from FIGS. 7 and 8 that the p-type well region 102P extends lengthwise along the X direction and may be regarded as an elongated semiconductor member that is doped with a p-type dopant. It is noted that the term "bottom" is used to refer to features in FIG. 8 as shown and does not in any way suggest or imply the orientation of the substrate during the fabrication processes. Some of the processes described here may be performed when the third semiconductor device 100-3 is turned upside down.

The isolation feature 132 and the dielectric layer 134 of the third semiconductor device 100-3 may be similar to those of the first semiconductor device 100-1 shown in FIG. 1. Detailed descriptions of them are therefore omitted for brevity.

Figure 9:
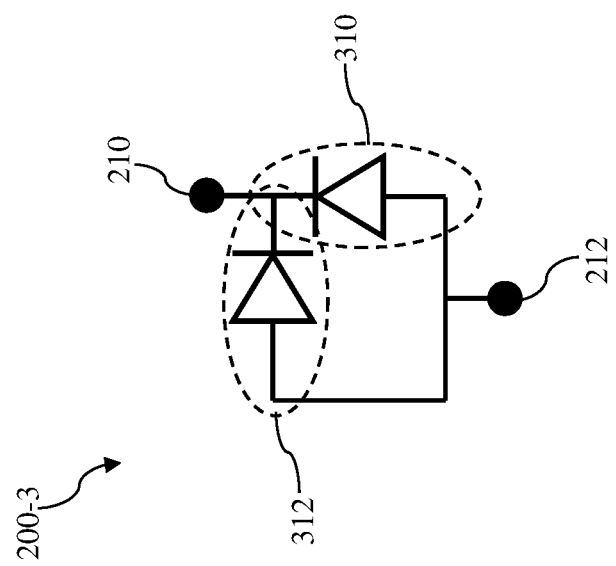
FIG. 9 illustrates an equivalent circuit diagram of the third semiconductor device in FIG. 7, according to various aspects of the present disclosure.

In some embodiments illustrated in FIG. 7, although the third semiconductor device 100-3 includes structures of a transistor, it does not function as one and is not connected as one. As shown in FIG. 7, the gate structure 110 is electrically floating and is not configured to turn on the channel members 108. The source/drain contact 120 over the n-type drain feature 116ND may be resistively coupled to a fifth node 210 and the source/drain contact 120 over p-type source feature 116PS and the backside conductive feature 130 may be resistively coupled together to a sixth node 212. When connected as such, the third semiconductor device 100-3 may be representatively and functionally shown as a third equivalent circuit 200-3 in FIG. 9. The third equivalent circuit 200-3 includes a fifth PN junction diode 310 and a sixth PN junction diode 312 that are connected in parallel. The fifth PN junction diode 310 corresponds to the n-type drain feature 116ND over and in contact with the p-type well region 102P and the sixth PN junction diode 312 corresponds to the p-type source feature 116PS coupled to the n-type drain feature 116ND by way of the channel members 108.

Figure 10:
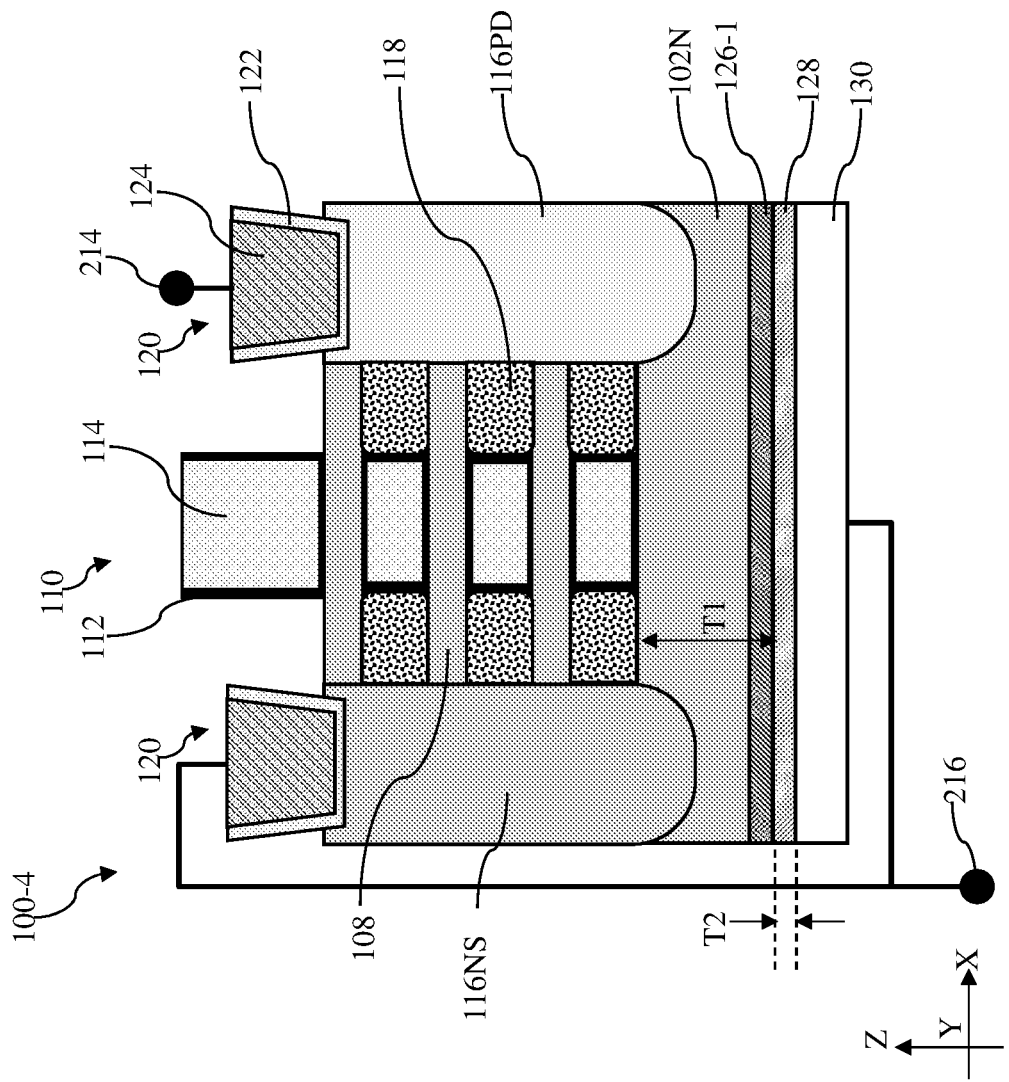
FIG. 10 is a fragmentary cross-section view a fourth semiconductor device along a first direction, according to various aspects of the present disclosure.

FIG. 10 illustrates a fragmentary cross-sectional view of a fourth semiconductor device 100-4 along the Y direction. In some embodiments represented in FIG. 10, the fourth semiconductor device 100-4 has a structure similar to a multi-bridge-channel (MBC) transistor that includes a plurality of bridge-like channel members (or channel structures). An MBC transistor may be referred to as a gate-all-around (GAA) transistor or a surrounding gate transistor (SGT) as its gate structure wraps around each of the channel members (or channel structures). An MBC transistor may also be referred to as nanosheet transistor or a nanowire transistor because each of the bridge-like channel members is nanoscale and may resemble a wire or a sheet. Referring now to FIG. 10, the fourth semiconductor device 100-4 includes a plurality of channel members 108 extending along the X direction between an n-type source feature 116NS and a p-type drain feature 116PD. A gate structure 110 that extends lengthwise along the Y direction wraps around each of the plurality of channel members 108. As shown in FIG. 10, the gate structure 110 includes a gate dielectric layer 112 and a gate electrode 114. The gate structure 110 is isolated from the n-type source features 116NS and the p-type drain feature 116PD by a plurality of inner spacer features 118. A source/drain contact 120 is disposed over and electrically coupled to each of the n-type source feature 116NS and the p-type drain feature 116PD. In some implementations represented in FIG. 10, the source/drain contact 120 includes a barrier layer 122 and a metal fill layer 124.

The channel members 108, the gate dielectric layer 112, gate electrode 114, the inner spacer features 118, the source/drain contact 120 of the fourth semiconductor device 100-4 may be similar to those of the first semiconductor device 100-1 shown in FIG. 1. Detailed descriptions of them are therefore omitted for brevity.

The gate structure 110, the n-type source feature 116NS, the p-type drain feature 116PD and the bottommost inner spacer features 118 are disposed on an n-type well region 102N. In some implementations, the n-type well region 102N is doped with an n-type dopant such as phosphorus (P) or arsenide (As) and has the first doping concentration between about $1 \times 10^{18}$ and about $5 \times 10^{18}$ atoms/cm$^2$. The n-type well region 102N is disposed over and electrically coupled to a backside conductive feature 130. In some embodiments, the backside conductive feature 130 may be a power rail that is coupled to Vdd (i.e., positive supply voltage) or Vss (i.e., ground or negative supply voltage). To reduce contact resistance between the n-type well region 102N and the backside conductive feature 130, the fourth semiconductor device 100-4 further includes the first epitaxial layer 126-1 and the silicide layer 128. In some implementations, the first epitaxial layer 126-1 is epitaxially grown on the n-type well region 102N is thus disposed directly on the n-type well region 102N. The silicide layer 128 interposes between the first epitaxial layer 126-1 and the backside conductive feature 130. In some embodiments, the first epitaxial layer 126-1 is doped in-situ with an n-type dopant, such as phosphorus (P) or arsenide (As), and has a second doping concentration between about $1 \times 10^{19}$ and about $1 \times 10^{20}$ atoms/cm$^2$. The silicide layer 128 may include titanium silicide (TiSi), nickel silicide (NiSi), cobalt silicide (CoSi), or titanium silicon nitride (TiSiN). The backside conductive feature 130 may be formed of tungsten (W), titanium (Ti), titanium nitride (TiN), ruthenium (Ru), cobalt (Co), nickel (Ni), or copper (Cu).

Figure 11:
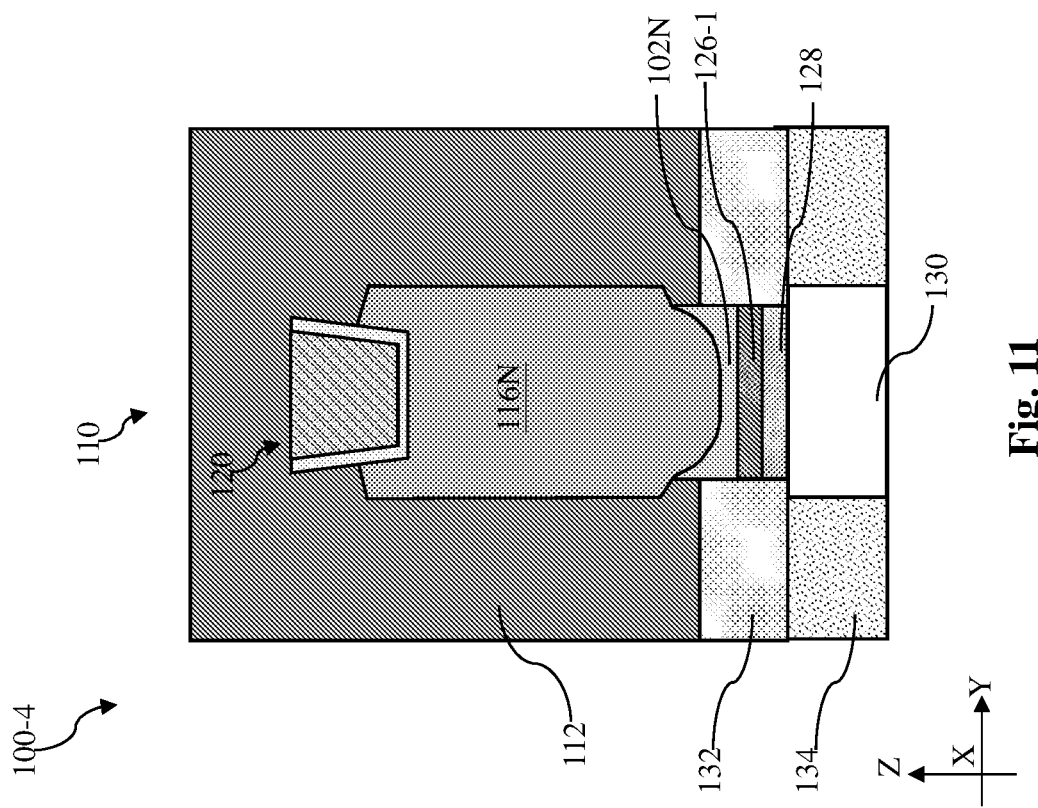
FIG. 11 is a fragmentary cross-section view the fourth semiconductor device in FIG. 10 along a second direction, according to various aspects of the present disclosure.

Reference is now made to FIG. 11, which illustrates a cross-sectional view of the fourth semiconductor device 100-4 along the X direction. The n-type well region 102N is defined in an isolation feature 132. It is noted that the isolation feature 132 is not shown in FIG. 10 as the cross-sectional plane of FIG. 10 does not cut through the isolation feature 132. The n-type well region 102N is formed from a substrate and the isolation feature 132 is disposed over the substrate. The structure shown in FIG. 11 is formed after planarizing the substrate using for example, a chemical mechanical polishing (CMP) process, until a bottom surface of the n-type well region 102N is coplanar with bottom surfaces of the isolation feature 132. After the planar bottom surface is formed, the n-type well region 102N is recessed to form a backside recess. The first epitaxial layer 126-1 is epitaxially grown over the exposed surface of the n-type well region 102N and the silicide layer 128 is formed over the first epitaxial layer 126-1. After a planarization process, such as a CMP process, a dielectric layer 134 is deposited over the isolation feature 132 and the silicide layer 128. An opening is then formed in the dielectric layer 134 by use of lithography processes and etch processes to expose the silicide layer 128. Thereafter, the backside conductive feature 130 is deposited over the silicide layer 128. Another planarization process, such as a CMP process, may be performed to planarize the bottom surface such that the bottom surface of the backside conductive feature 130 and the top surface of the dielectric layer 134 are coplanar. As a result, the backside conductive feature 130 is disposed within the dielectric layer 134. The first epitaxial layer 126-1 and the silicide layer 128 are disposed within the isolation feature 132. It can be seen from FIGS. 10 and 11 that the n-type well region 102N extends lengthwise along the X direction and may be regarded as an elongated semiconductor member that is doped with an n-type dopant. It is noted that the term "bottom" is used to refer to features in FIG. 11 as shown and does not in any way suggest or imply the orientation of the substrate during the fabrication processes. Some of the processes described here may be performed when the fourth semiconductor device 100-4 is turned upside down.

The isolation feature 132 and the dielectric layer 134 of the fourth semiconductor device 100-4 may be similar to those of the first semiconductor device 100-1 shown in FIG. 1. Detailed descriptions of them are therefore omitted for brevity.

Figure 12:
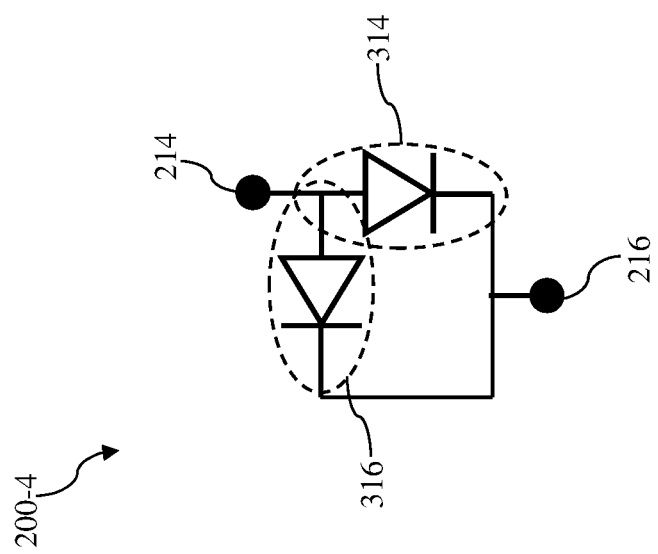
FIG. 12 illustrates an equivalent circuit diagram of the fourth semiconductor device in FIG. 10, according to various aspects of the present disclosure.

In some embodiments illustrated in FIG. 10, although the fourth semiconductor device 100-4 includes structures of a transistor, it does not function as one and is not connected as one. As shown in FIG. 10, the gate structure 110 is electrically floating and is not configured to turn on the channel members 108. The source/drain contact 120 over the p-type drain feature 116PD may be resistively coupled to a seventh node 214 and the source/drain contact 120 over the n-type source feature 116NS and the backside conductive feature 130 may be resistively coupled together to an eighth node 216. When connected as such, the fourth semiconductor device 100-4 may representatively and functionally shown as a fourth equivalent circuit 200-4 in FIG. 12. The fourth equivalent circuit 200-4 includes a seventh PN junction diode 314 and an eighth PN junction diode 316 that are connected in parallel. The seventh PN junction diode 314 corresponds to the p-type drain feature 116PD over and in contact with the n-type well region 102N and the eighth PN junction diode 316 corresponds to the p-type drain feature 116PD coupled to the n-type source feature 116NS by way of the channel members 108.

Figure 13:
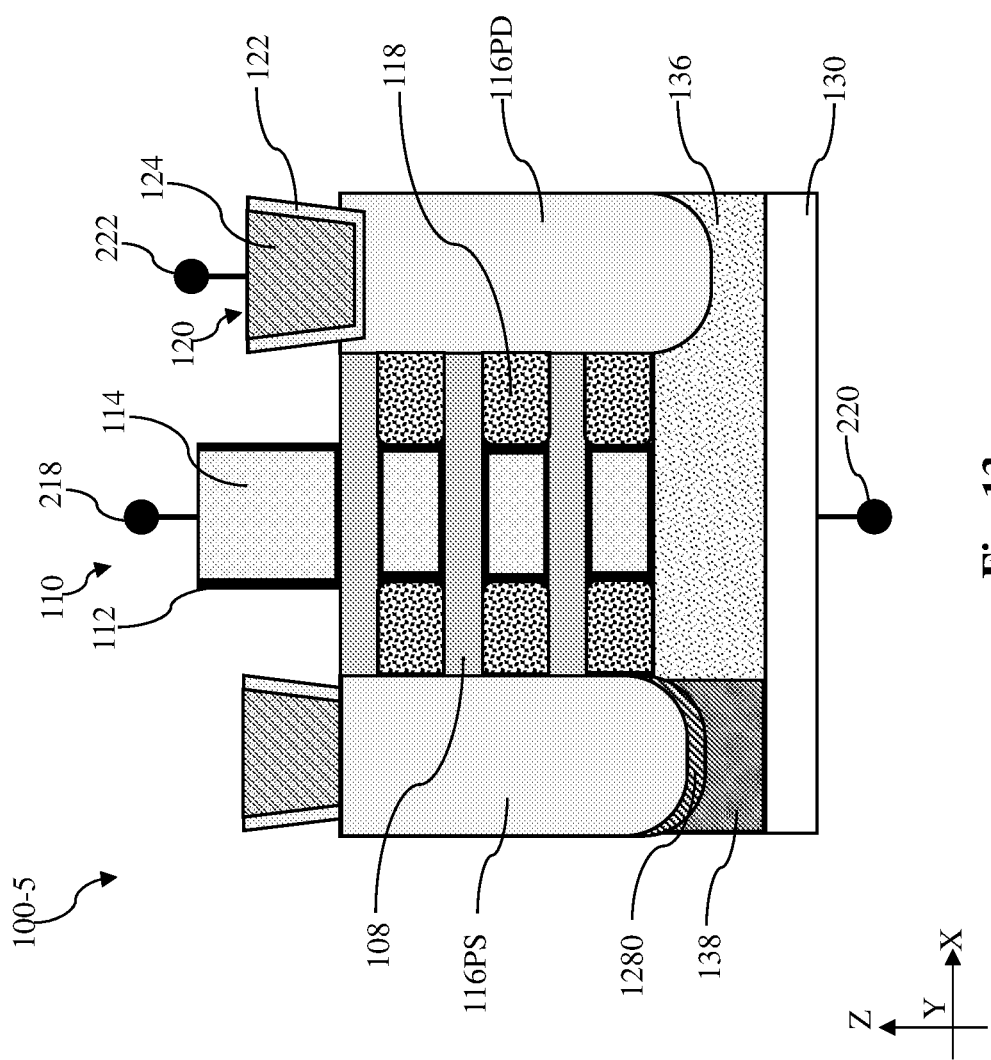
FIG. 13 is a fragmentary cross-section view a fifth semiconductor device, according to various aspects of the present disclosure.

FIG. 13 illustrates a fragmentary cross-sectional view of a fifth semiconductor device 100-5 along the Y direction. In some embodiments represented in FIG. 13, the fifth semiconductor device 100-5 is an MBC transistor that includes a plurality of bridge-like channel members (or channel structures). An MBC transistor may be referred to as a gate-all-around (GAA) transistor or a surrounding gate transistor (SGT) as its gate structure wraps around each of the channel members (or channel structures). An MBC transistor may also be referred to as nanosheet transistor or a nanowire transistor because each of the bridge-like channel members is nanoscale and may resemble a wire or a sheet. Referring now to FIG. 13, the fifth semiconductor device 100-5 includes a plurality of channel members 108 extending along the X direction between a p-type source features 116PS and a p-type drain feature 116PD. A gate structure 110 that extends lengthwise along the Y direction wraps around each of the plurality of channel members 108. As shown in FIG. 13, the gate structure 110 includes a gate dielectric layer 112 and a gate electrode 114. The gate structure 110 is isolated from the p-type source features 116PS and the p-type drain feature 116PD by a plurality of inner spacer features 118. A source/drain contact 120 is disposed over and electrically coupled to each of the p-type source feature 116PS and the p-type drain feature 116PD. In some implementations represented in FIG. 13, the source/drain contact 120 includes a barrier layer 122 and a metal fill layer 124.

The channel members 108, the gate dielectric layer 112, gate electrode 114, the inner spacer features 118, the source/drain contact 120 of the fifth semiconductor device 100-5 may be similar to those of the first semiconductor device 100-1 shown in FIG. 1. Detailed descriptions of them are therefore omitted for brevity.

In some embodiments illustrated in FIG. 13, the fifth semiconductor device 100-5 includes a backside source contact via 138 that couples the p-type source feature 116PS to a backside conductive feature 130. To reduce contact resistance between the p-type source feature 116PS and the backside source contact via 138, the fifth semiconductor device 100-5 further includes a silicide feature 1280. The bottommost inner spacer features 118, the gate structure 110, and the p-type drain feature 116PD are disposed over a filler dielectric layer 136. The silicide feature 1280 may include titanium silicide (TiSi), nickel silicide (NiSi), cobalt silicide (CoSi), or titanium silicon nitride (TiSiN). The backside source contact via 138 may be formed of tungsten (W), titanium (Ti), titanium nitride (TiN), ruthenium (Ru), cobalt (Co), nickel (Ni), or copper (Cu). The filler dielectric layer 136 may have a composition similar to that of the dielectric layer 134. In some instances, the filler dielectric layer 136 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials.

Figure 14:
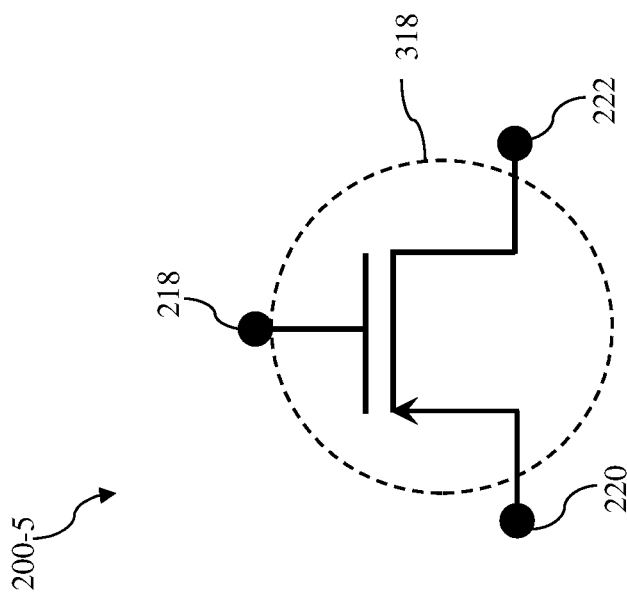
FIG. 14 illustrates an equivalent circuit diagram of the fifth semiconductor device in FIG. 13, according to various aspects of the present disclosure.

In some embodiments illustrated in FIG. 13, the fifth semiconductor device 100-5 functions as a transistor and is electrically connected as one. As shown in FIG. 13, the gate structure 110 of the fifth semiconductor device 100-5 is resistively coupled to a first gate node 218, the p-type source feature 116PS is resistively coupled to a first source node 220, and the p-type drain feature 116PD is resistively coupled to a first drain node 222. When connected as such, the fifth semiconductor device 100-5 may be represented as a fifth equivalent circuit 200-5 in FIG. 14. In some instances, the fifth equivalent circuit 200-5 includes a p-type transistor 318.

Figure 15:
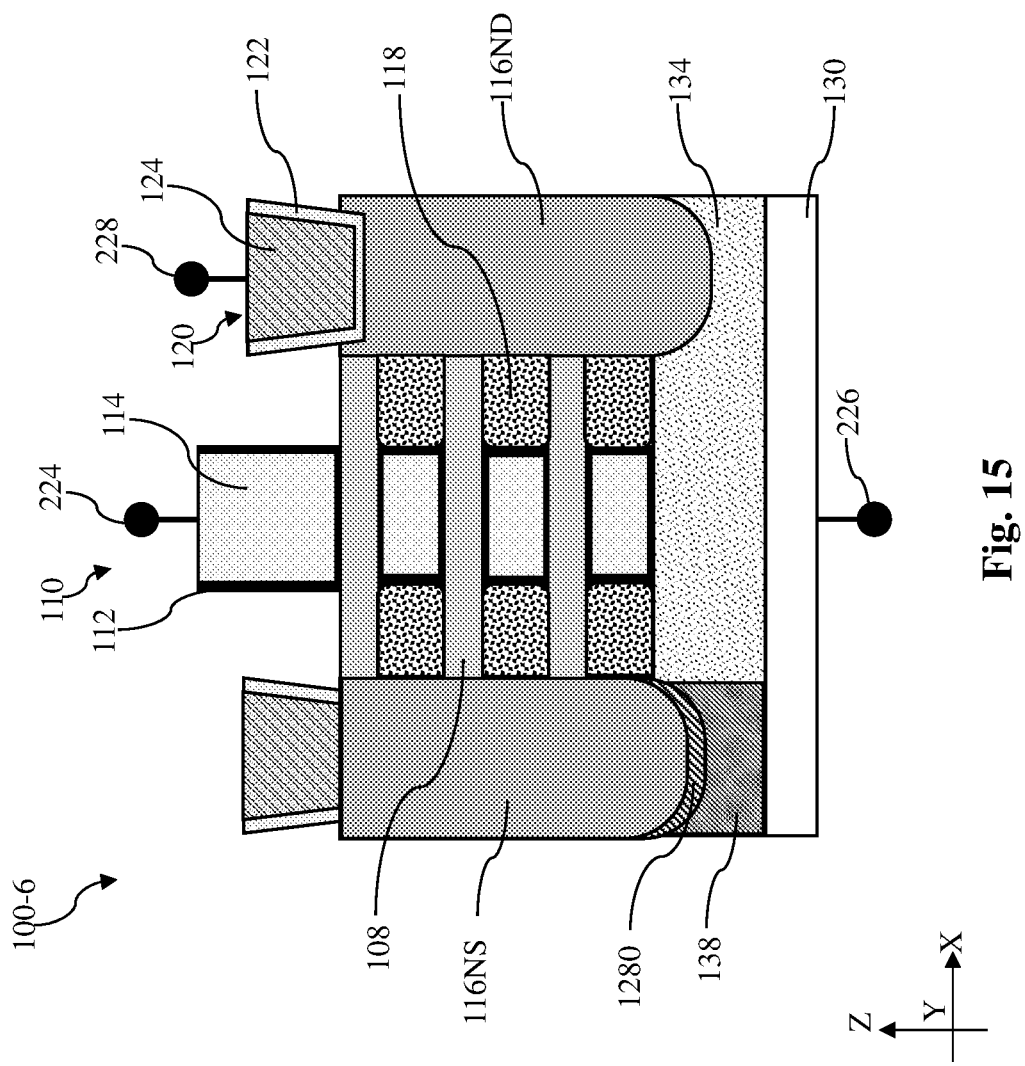
FIG. 15 is a fragmentary cross-section view a sixth semiconductor device, according to various aspects of the present disclosure.

FIG. 15 illustrates a fragmentary cross-sectional view of a sixth semiconductor device 100-6 along the Y direction. In some embodiments represented in FIG. 15, the sixth semiconductor device 100-6 is an MBC transistor that includes a plurality of bridge-like channel members (or channel structures). An MBC transistor may be referred to as a gate-all-around (GAA) transistor or a surrounding gate transistor (SGT) as its gate structure wraps around each of the channel members (or channel structures). An MBC transistor may also be referred to as nanosheet transistor or a nanowire transistor because each of the bridge-like channel members is nanoscale and may resemble a wire or a sheet. Referring now to FIG. 15, the sixth semiconductor device 100-6 includes a plurality of channel members 108 extending along the X direction between an n-type source features 116NS and an n-type drain feature 116ND. A gate structure 110 that extends lengthwise along the Y direction wraps around each of the plurality of channel members 108. As shown in FIG. 15, the gate structure 110 includes a gate dielectric layer 112 and a gate electrode 114. The gate structure 110 is isolated from the n-type source features 116NS and the n-type drain feature 116ND by a plurality of inner spacer features 118. A source/drain contact 120 is disposed over and electrically coupled to each of the n-type source feature 116NS and the n-type drain feature 116ND. In some implementations represented in FIG. 15, the source/drain contact 120 includes a barrier layer 122 and a metal fill layer 124.

The channel members 108, the gate dielectric layer 112, gate electrode 114, the inner spacer features 118, the source/drain contact 120 of the sixth semiconductor device 100-6 may be similar to those of the first semiconductor device 100-1 shown in FIG. 1. Detailed descriptions of them are therefore omitted for brevity.

In some embodiments illustrated in FIG. 15, the sixth semiconductor device 100-6 includes a backside source contact via 138 that couples the n-type source feature 116NS to a backside conductive feature 130. To reduce contact resistance between the n-type source feature 116NS and the backside source contact via 138, the sixth semiconductor device 100-6 further includes a silicide feature 1280. The bottommost inner spacer features 118, the gate structure 110, and the n-type drain feature 116ND are disposed over a filler dielectric layer 136. The silicide feature 1280 may include titanium silicide (TiSi), nickel silicide (NiSi), cobalt silicide (CoSi), or titanium silicon nitride (TiSiN). The backside source contact via 138 may be formed of tungsten (W), titanium (Ti), titanium nitride (TiN), ruthenium (Ru), cobalt (Co), nickel (Ni), or copper (Cu). The filler dielectric layer 136 may have a composition similar to that of the dielectric layer. In some instances, the filler dielectric layer 136 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials.

Figure 16:
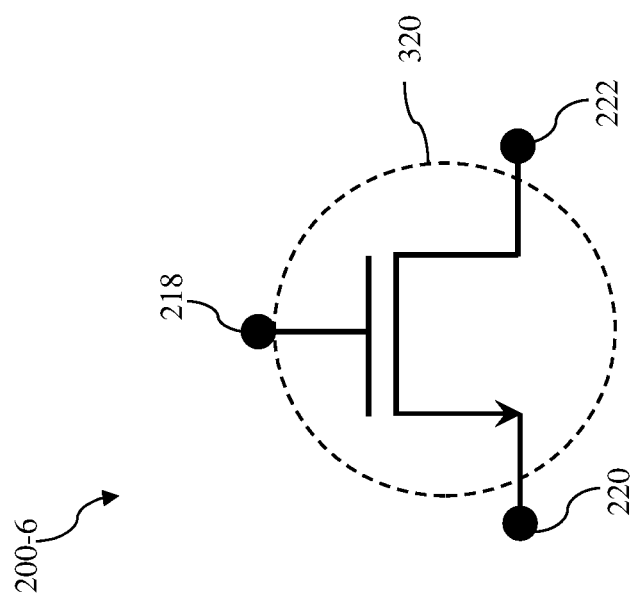
FIG. 16 illustrates an equivalent circuit diagram of the sixth semiconductor device in FIG. 13, according to various aspects of the present disclosure.

In some embodiments illustrated in FIG. 15, the sixth semiconductor device 100-6 functions as a transistor and is electrically connected as one. As shown in FIG. 15, the gate structure 110 of the sixth semiconductor device 100-6 is resistively coupled to a second gate node 224, the n-type source feature 116NS is resistively coupled to a second source node 226, and the n-type drain feature 116ND is resistively coupled to a second drain node 228. When connected as such, the sixth semiconductor device 100-6 may be represented in a sixth equivalent circuit 200-6 in FIG. 16. In some instances, the sixth equivalent circuit 200-6 includes an n-type transistor 320.

Reference is now made to FIG. 17. One or more of the first semiconductor device 100-1, the second semiconductor device 100-2, the third semiconductor device 100-3, the fourth semiconductor device 100-4, the fifth semiconductor device 100-5, and the sixth semiconductor device 100-6 may be fabricated on a substrate to form an integrated circuit (IC) device 1000 to perform various functions according to various design needs. In some instances when more than one of the first semiconductor device 100-1, the second semiconductor device 100-2, the third semiconductor device 100-3, the fourth semiconductor device 100-4, the fifth semiconductor device 100-5, and the sixth semiconductor device 100-6 are fabricated on the same substrate, they may share the same backside conductive feature 130, as illustrated in FIGS. 1, 4, 7, 10, 13, and 15. Although the first semiconductor device 100-1, the second semiconductor device 100-2, the third semiconductor device 100-3, the fourth semiconductor device 100-4, the fifth semiconductor device 100-5, and the sixth semiconductor device 100-6 all share similar MBC-transistor-like structures, the first semiconductor device 100-1, the second semiconductor device 100-2, the third semiconductor device 100-3, and the fourth semiconductor device 100-4 offer various PN junction diode structures to meet different circuit design needs. When an IC design that includes only transistors and PN junction diodes, the IC design can be fully implemented using the semiconductor devices of the present disclosure. When an IC design that includes transistors, PN junction diodes and other active/passive devices, the number of similarly structured device can be increased by adopting the semiconductor devices of the present disclosure. Due to their structural similarities, adoption of the MBC transistors and PN junction diodes of the present disclosure can streamline fabrication processes and reduce loading-dependent defects.

In one example aspect, the present disclosure provides a semiconductor structure in accordance with some embodiments. The semiconductor structure includes an elongated semiconductor member surrounded by an isolation feature and extending lengthwise along a first direction, the elongated semiconductor member including a top surface and an opposing bottom surface, a first source/drain feature and a second source/drain feature over the top surface of the elongated semiconductor member, a vertical stack of channel members each extending lengthwise between the first source/drain feature and the second source/drain feature along the first direction, a gate structure wrapping around each of the vertical stack of channel members, a silicide layer underlying the elongated semiconductor member, and a conductive layer disposed on the silicide layer.

In some embodiments, the semiconductor device may further include an epitaxial layer disposed between the elongated semiconductor member and the silicide layer. In some embodiments, the elongated semiconductor member and the epitaxial layer are doped with the same type of dopant and a doping concentration of the epitaxial layer is greater than a doping concentration of the elongated semiconductor member. In some implementations, the elongated semiconductor member is doped by at least one dopant of a first type, the first source/drain feature is doped by at least one dopant of a second type, the second source/drain feature is doped by at least one dopant of a third type, and the first type is different from at least one of the second type and the third type. In some implementations, the second type is different from the third type. In some instances, the second type is the same as the third type. In some embodiments, the gate structure is electrically floating. In some implementations, the first source/drain feature is resistively coupled to the second source/drain feature. In some instances, the first source/drain feature is resistively coupled to the conductive layer.

Another one aspect of the present disclosure pertains to a semiconductor device. The semiconductor device includes a well region extending lengthwise along a direction and being disposed in an isolation feature, a first source/drain feature and a second source/drain feature over the well region, a vertical stack of channel members each extending lengthwise between the first source/drain feature and the second source/drain feature along the direction, a gate structure wrapping around each of the vertical stack of channel members, an epitaxial layer below the well region, a silicide layer below and in contact with the epitaxial layer, and a conductive layer below and in contact with the silicide layer.

In some embodiments, the gate structure is electrically floating. In some implementations, the first source/drain feature is resistively coupled to the second source/drain feature. In some embodiments, the first source/drain feature and the second source/drain feature are doped with a first type dopant. In some implementations, the well region is doped with a second type dopant different from the first type dopant. In some instances, the first source/drain feature is resistively coupled to the conductive layer. In some embodiments, the first source/drain feature is doped with a first type dopant and the second source/drain feature is doped with a second type dopant different from the first type dopant.

Yet another aspect of the present disclosure pertains to a semiconductor device. The semiconductor device includes a transistor and a PN junction diode structure. The transistor includes a first conductive layer, a dielectric layer over the first conductive layer, a backside contact via extending through the dielectric layer, a silicide feature disposed on the backside contact via, a source feature disposed on and in contact with the silicide feature, a drain feature disposed on the dielectric layer and insulated from the first conductive layer, a first plurality of channel members each extending lengthwise between the source feature and the drain feature, and a first gate structure wrapping around each of the channel members and extending lengthwise along a first direction. The PN junction diode structure includes a second conductive layer, a silicide layer disposed on the second conductive layer, an epitaxial layer disposed on the silicide layer, an elongated semiconductor member disposed on the epitaxial layer and extending lengthwise along a second direction perpendicular to the first direction, a first source/drain feature and a second source/drain feature over the elongated semiconductor member, a second plurality of channel members each extending lengthwise between the first source/drain feature and the second source/drain feature, and a second gate structure wrapping around each of the channel members and extending lengthwise along the first direction.

In some embodiments, the elongated semiconductor member and the epitaxial layer are doped with the same type of dopant and a doping concentration of the epitaxial layer is greater than a doping concentration of the elongated semiconductor member. In some implementations, the first source/drain feature is resistively coupled to the second conductive layer. In some instances, the second gate structure is electrically floating.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor structure, comprising:
   a backside dielectric layer;
   a backside conductive feature disposed in the backside dielectric layer and extending lengthwise along a first direction;
   an isolation feature disposed over the backside dielectric layer;
   a silicide layer disposed on the backside conductive feature;
   an epitaxial layer disposed on the silicide layer;
   a semiconductor feature disposed on the epitaxial layer; and
   a first source/drain feature disposed on the semiconductor feature.

2. The semiconductor structure of claim 1, further comprising:
   a second source/drain feature disposed on the semiconductor feature; and
   a plurality of channel members extending between the first source/drain feature and the second source/drain feature along the first direction.

3. The semiconductor structure of claim 2, wherein the first source/drain feature and the second source/drain feature are electrically coupled together.

4. The semiconductor structure of claim 2,
   wherein the semiconductor feature comprises a first type dopant,
   wherein the first source/drain feature and the second source/drain feature comprise a second type dopant different from the first type dopant,
   wherein the epitaxial layer comprises the first type dopant.

5. The semiconductor structure of claim 4, wherein a concentration of the first type dopant in the epitaxial layer is greater than a concentration of the first type dopant in the first source/drain feature and the second source/drain feature.

6. The semiconductor structure of claim 2, further comprising:
   a gate structure wrapping around each of the plurality of channel members.

7. The semiconductor structure of claim 6, wherein the gate structure is electrically floating.

8. The semiconductor structure of claim 6, wherein the gate structure is spaced apart from the first source/drain feature and the second source/drain feature by a plurality of inner spacer features.

9. The semiconductor structure of claim 1, wherein the silicide layer, the epitaxial layer, and the semiconductor feature are sandwiched between a first portion of the isolation feature and a second portion of the isolation feature along a second direction perpendicular to the first direction.

10. The semiconductor structure of claim 1, wherein the silicide layer comprises titanium silicide (TiSi), nickel silicide (NiSi), cobalt silicide (CoSi), or titanium silicon nitride (TiSiN).

11. A semiconductor structure, comprising:
a backside conductive feature extending lengthwise along a first direction;
a silicide layer disposed on the backside conductive feature and extending along the first direction;
an epitaxial layer disposed on the silicide layer and extending along the first direction;
a semiconductor feature disposed on the epitaxial layer and extending along the first direction;
a first source/drain feature and a second source/drain feature disposed over the semiconductor feature;
a plurality of nanostructures extending between the first source/drain feature and the second source/drain feature along the first direction; and
a gate structure wrapping around each of the plurality of nanostructures,
wherein the first source/drain feature is electrically coupled to the backside conductive feature.

12. The semiconductor structure of claim 11, wherein the gate structure is electrically floating.

13. The semiconductor structure of claim 11,
wherein the first source/drain feature and the semiconductor feature are doped with a first type dopant,
wherein the second source/drain feature is doped with a second type dopant different from the first type dopant.

14. The semiconductor structure of claim 11, wherein the silicide layer, the epitaxial layer, and the semiconductor feature are sandwiched between a first portion and a second portion of an isolation feature along a second direction perpendicular to the first direction.

15. The semiconductor structure of claim 11, wherein the silicide layer comprises a thickness between about 3 nm and about 5 nm.

16. A device, comprising:
a first PN junction diode comprising:
a well region doped with a dopant of a first conductivity type,
a first epitaxial feature disposed over the well region, the first epitaxial feature being doped with a dopant of a second conductivity type different from the first conductivity type,
a first contact disposed on and in contact with the first epitaxial feature, and
a backside conductive feature disposed below the well region; and
a second PN junction diode comprising:
a second epitaxial feature disposed over the well region and spaced apart from the first epitaxial feature, the second epitaxial feature being doped with the dopant of the first conductivity type,
a plurality of nanostructures extending between the first epitaxial feature and the second epitaxial feature along a first directions, and
the first epitaxial feature.

17. The device of claim 16, further comprising:
a gate structure wrapping around each of the plurality of nanostructures,
wherein the gate structure is electrically floating.

18. The device of claim 17, wherein the gate structure is spaced apart from the first epitaxial feature and the second epitaxial feature by a plurality of inner spacer features.

19. The device of claim 16, further comprising:
a silicide layer disposed on the backside conductive feature; and
an epitaxial layer disposed on the silicide layer,
wherein the silicide layer and the epitaxial layer are sandwiched between the well region and the backside conductive feature.

20. The device of claim 19, wherein the silicide layer comprises titanium silicide (TiSi), nickel silicide (NiSi), cobalt silicide (CoSi), or titanium silicon nitride (TiSiN).

* * * * *